United States Patent
Takizawa et al.

(10) Patent No.: US 10,457,156 B2
(45) Date of Patent: Oct. 29, 2019

(54) VEHICLE POWER SOURCE SYSTEM AND COOLING CIRCUIT

(71) Applicant: HONDA MOTOR CO., LTD., Tokyo (JP)

(72) Inventors: Daijiro Takizawa, Wako (JP); Satoko Ito, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 124 days.

(21) Appl. No.: 15/528,835

(22) PCT Filed: Oct. 27, 2015

(86) PCT No.: PCT/JP2015/080265
§ 371 (c)(1),
(2) Date: May 23, 2017

(87) PCT Pub. No.: WO2016/088474
PCT Pub. Date: Jun. 9, 2016

(65) Prior Publication Data
US 2017/0305293 A1 Oct. 26, 2017

(30) Foreign Application Priority Data

Dec. 4, 2014 (JP) .................................. 2014-245940

(51) Int. Cl.
*B60L 11/18* (2006.01)
*H05K 7/20* (2006.01)
(Continued)

(52) U.S. Cl.
CPC ............ *B60L 11/1874* (2013.01); *B60K 1/04* (2013.01); *B60L 50/66* (2019.02); *B60L 53/00* (2019.02);
(Continued)

(58) Field of Classification Search
CPC .... B60K 11/02; B60K 1/04; B60K 2001/003; B60K 2001/005; B60K 2001/0422;
(Continued)

(56) References Cited

U.S. PATENT DOCUMENTS 5,624,003 A * 4/1997 Matsuki ............. B60H 1/00278
180/65.1
2008/0295535 A1 12/2008 Robinet et al.
(Continued)

FOREIGN PATENT DOCUMENTS

CN 101578190 A 11/2009
JP 2005-012890 A 1/2005
(Continued)

OTHER PUBLICATIONS

Japanese Office Action application No. 2016-562348 dated Nov. 14, 2017.
(Continued)

*Primary Examiner* — Lingwen R Zeng
(74) *Attorney, Agent, or Firm* — Squire Patton Boggs (US) LLP

(57) ABSTRACT

A vehicle power source system includes: a high-voltage battery; a high-voltage system equipment having a DC-DC converter and a charger; and a cooling circuit having a high-voltage battery cooling unit for cooling the high-voltage battery, a DC-DC converter cooling unit for cooling the DC-DC converter, and charger cooling unit for cooling the charger. In the cooling circuit, the DC-DC converter cooling unit and the charger cooling unit are disposed in parallel on a downstream side of the high-voltage battery cooling unit.

8 Claims, 7 Drawing Sheets

(51) Int. Cl.
| | |
|---|---|
| *H01M 10/6568* | (2014.01) |
| *H01M 10/625* | (2014.01) |
| *H01M 10/46* | (2006.01) |
| *H01M 10/613* | (2014.01) |
| *B60K 1/04* | (2019.01) |
| *H01M 10/6556* | (2014.01) |
| *H01M 10/42* | (2006.01) |
| *H01M 2/10* | (2006.01) |
| *B60L 53/00* | (2019.01) |
| *B60L 58/26* | (2019.01) |
| *B60L 50/60* | (2019.01) |
| *B60K 11/02* | (2006.01) |
| *B60K 1/00* | (2006.01) |

(52) U.S. Cl.
CPC ........... *B60L 58/26* (2019.02); *H01M 2/1072* (2013.01); *H01M 10/425* (2013.01); *H01M 10/46* (2013.01); *H01M 10/613* (2015.04); *H01M 10/625* (2015.04); *H01M 10/6556* (2015.04); *H01M 10/6568* (2015.04); *H05K 7/20272* (2013.01); *H05K 7/20872* (2013.01); *H05K 7/20927* (2013.01); *B60K 11/02* (2013.01); *B60K 2001/003* (2013.01); *B60K 2001/005* (2013.01); *B60K 2001/0422* (2013.01); *B60K 2001/0433* (2013.01); *B60K 2001/0438* (2013.01); *B60L 2210/10* (2013.01); *H01M 2220/20* (2013.01); *Y02T 10/7005* (2013.01); *Y02T 10/705* (2013.01); *Y02T 10/7072* (2013.01); *Y02T 10/7216* (2013.01); *Y02T 90/127* (2013.01); *Y02T 90/14* (2013.01)

(58) Field of Classification Search
CPC .... B60K 2001/0433; B60K 2001/0438; B60L 11/1809; B60L 11/1874; B60L 11/1877; B60L 2210/10; H01M 10/425; H01M 10/46; H01M 10/613; H01M 10/625; H01M 10/6556; H01M 10/6568; H01M 2220/20; H01M 2/1072; H05K 7/20272; H05K 7/20872; H05K 7/20927; Y02T 10/7005; Y02T 10/7216

See application file for complete search history.

(56) References Cited

U.S. PATENT DOCUMENTS

| | | | |
|---|---|---|---|
| 2010/0050676 | A1 | 3/2010 | Takamatsu et al. |
| 2013/0030622 | A1 | 1/2013 | Park et al. |
| 2014/0038009 | A1 | 2/2014 | Okawa et al. |
| 2014/0076979 | A1* | 3/2014 | Weng ..................... B60L 1/003 236/74 R |

FOREIGN PATENT DOCUMENTS

| | | |
|---|---|---|
| JP | 2008-105645 A | 5/2008 |
| JP | 2009-006744 A | 1/2009 |
| JP | 2009-126256 A | 6/2009 |
| JP | 2010-119275 A | 5/2010 |
| JP | 2012-226895 A | 11/2012 |
| JP | 2013028323 A | 2/2013 |
| WO | 2016088475 A1 | 6/2016 |

OTHER PUBLICATIONS

International Search Report and Written Opinion dated Jan. 19, 2016 corresponding to International Patent Application No. PCT/JP2015/080265, and English translation thereof.

Oct. 9, 2018 Office Action issued in Chinese Patent Application No. 201580061904.8.

\* cited by examiner

VEHICLE POWER SOURCE SYSTEM AND COOLING CIRCUIT

TECHNICAL FIELD

The present invention relates to a vehicle power source system and a cooling circuit which are provided on an electric vehicle or the like.

BACKGROUND ART

There is known a vehicle power source system which includes a high-voltage battery and high-voltage system equipment and in which the high-voltage battery and the high-voltage system equipment are cooled by a single cooling circuit (for example, refer to Patent Literature 1). Additionally, there is also known a cooling circuit which includes two high-voltage system equipment cooling units which are disposed in series and in which two pieces of high-voltage system equipment (a DC-DC converter and an inverter) are cooled at the same time by those high-voltage system equipment cooling units (for example, refer to Patent Literature 2). Further, there is known a cooling circuit in which in cooling a plurality of high-voltage battery modules by a single cooling system, the high-voltage battery modules can be cooled selectively through a flow path switching control (for example, refer to Patent Literature 3).

PRIOR ART LITERATURE

Patent Literature

Patent Literature 1: JP-A-2005-12890
Patent Literature 2: JP-A-2010-119275
Patent Literature 3: JP-A-2012-226895

SUMMARY OF THE INVENTION

Problem that the Invention is to Solve

In the cooling circuit described in Patent Literature 2, however, in cooling the two pieces of high-voltage system equipment at the same time, since the two high-voltage system equipment cooling units are disposed in series, even in the event that the two pieces of high-voltage system equipment have different refrigerant flow rate requirements, the refrigerant flow rate needs to be set so as to match a greater refrigerant flow rate requirement. As a result, the pressure loss becomes great, whereby a high delivery capacity is required on the cooling pump.

According to the cooling circuit described in Patent Literature 3, although the temperatures of the high-voltage battery modules can be controlled accurately, the circuit configuration becomes complex and many flow path selectors are required. As a result, the circuit configuration not only increases the cost but also requires a complex flow path selection control, resulting in a complex control.

The invention provides a vehicle power source system and a cooling circuit which can cool a high-voltage battery and high-voltage system equipment in an ensured fashion even by cooling the high-voltage battery and the high-voltage system equipment using a single cooling circuit and which can suppress the delivery capacity of a cooling pump by reducing a pressure loss.

Means for Solving the Problem

The invention provides the following aspects.
According to a first aspect of the invention, there is provided a vehicle power source system (e.g., a vehicle power source system 1 in embodiment) including:
a high-voltage battery (e.g., high-voltage batteries 31*a* to 33*a* in embodiment);
a high-voltage system equipment having a DC-DC converter (e.g., a DC-DC converter 22 in embodiment) and a charger (e.g., a charger 21 in embodiment); and
a cooling circuit (e.g., a cooling circuit 100 in embodiment) having a high-voltage battery cooling unit (e.g., a high-voltage battery cooling unit 130 in embodiment) for cooling the high-voltage battery, a DC-DC converter cooling unit (e.g., a DC-DC converter cooling unit 122 in embodiment) for cooling the DC-DC converter, and a charger cooling unit (e.g., a charger cooling unit 121 in embodiment) for cooling the charger, wherein
in the cooling circuit, the DC-DC converter cooling unit and the charger cooling unit are disposed in parallel on a downstream side of the high-voltage battery cooling unit.

According to a second aspect, in the vehicle power source system according to the first aspect,
the cooling circuit has a flow rate control device (e.g., an orifice 107 in embodiment) on an upstream side or a downstream side of the DC-DC converter cooling unit.

According to a third aspect, in the vehicle power source system according to the first or second aspect,
the cooling circuit has:
a bypass flow path (e.g., a bypass flow path 105 in embodiment) which connects an upstream side of the high-voltage battery cooling unit to a portion that is positioned on an upstream side of the DC-DC converter cooling unit and the charger cooling unit and that is positioned on a downstream side of the high-voltage battery cooling unit; and
a flow path selector (e.g., a three-way solenoid valve 106 in embodiment) which is provided on the upstream side of the high-voltage battery cooling unit.

According to a fourth aspect, in the vehicle power source system according to the third aspect,
the flow path selector is a solenoid valve.

According to a fifth aspect, in the vehicle power source system according to the third or fourth aspect,
the flow path selector is a three-way solenoid valve which is provided at a branch portion (e.g., a branch portion 114 in embodiment) where the bypass flow path branches off from an upstream-side flow path (e.g., a sixth external piping 103*f* in embodiment) of the high-voltage battery cooling unit.

According to a sixth aspect, there is provided a cooling circuit (e.g., the cooling circuit 100 in embodiment) including:
a radiator (e.g., a radiator 101 in embodiment);
a cooling pump (e.g., a cooling pump 102 in embodiment);
a high-voltage battery cooling unit (e.g., the high-voltage battery cooling unit 130 in embodiment) for cooling a high-voltage battery (e.g., the high-voltage batteries 31*a* to 33*a* in embodiment); and
a high-voltage system equipment cooling unit (e.g., the high-voltage system equipment cooling unit 120 in embodiment) for a cooling high-voltage system equipment (e.g., the DC-DC converter 22, the charger 21 in embodiment),
the radiator, the cooling pump, the high-voltage battery cooling unit, and the high-voltage system equipment cooling unit being connected in series, wherein the high-voltage system equipment cooling unit has at least two cooling units (e.g., the DC-DC converter cooling unit 122 and the charger cooling unit 121 in embodiment), and wherein the at least two cooling units are disposed in parallel on a downstream side of the high-voltage battery cooling unit.

According to a seventh aspect, in the cooling circuit according to the sixth aspect, the at least two high-voltage system equipment cooling units include a DC-DC converter cooling unit (e.g., the DC-DC converter cooling unit 122 in embodiment) and a charger cooling unit (e.g., the charger cooling unit 121 in embodiment), and a flow rate control device (e.g., the orifice 107 in embodiment) is provided on an upstream side or a downstream side of the DC-DC converter cooling unit.

According to an eighth aspect, in the cooling circuit according to the seventh, the cooling circuit has:

a bypass flow path (e.g., the bypass flow path 105 in embodiment) which connects an upstream side of the high-voltage battery cooling unit to a portion that is positioned on an upstream side of the DC-DC converter cooling unit and the charger cooling unit and that is positioned on a downstream side of the high-voltage battery cooling unit; and a flow path selector (e.g., the three-way solenoid valve 106 in embodiment) which is provided on the upstream side of the high-voltage battery cooling unit.

According to a ninth aspect, in the cooling circuit according to the eighth aspect, the flow path selector is a solenoid valve.

According to a tenth aspect, in the cooling circuit according to the eighth or ninth aspect, the flow path selector is a three-way solenoid valve which is provided at a branch portion (e.g., the branch portion 114 in embodiment) where the bypass flow path branches off from an upstream-side flow path (e.g., the sixth external piping 103f in embodiment) of the high-voltage battery cooling unit.

Advantages of the Invention

According to the first aspect, since the DC-DC converter cooling unit and the charger cooling unit which are the high-voltage system equipment cooling units are disposed in parallel, the pressure loss can be reduced when compared with a case where the DC-DC converter cooling unit and the charger cooling unit are disposed in series. Additionally, even though the refrigerant flow rate requirements of the DC-DC converter cooling unit and the charger cooling unit are different, the refrigerant matching the respective refrigerant flow rate requirements can be supplied to the DC-DC converter cooling unit and the charger cooling unit without any waste, and therefore, the delivery capacity of the cooling pump can be suppressed. Since the high-voltage battery cooling unit is disposed on the upstream side of the DC-DC converter cooling unit and the charger cooling unit, even in such a situation that both the high-voltage battery and the high-voltage system equipment are cooled together, the high-voltage battery whose control temperature is lower (which is less heat-resistant) can be cooled in an ensured fashion without being affected by the temperature of the high-voltage system equipment.

According to the second and seventh aspects, the cooling circuit has the flow rate control device on the upstream side or downstream side of the DC-DC converter cooling unit, and therefore, the flow rate of refrigerant supplied to the DC-DC converter cooling unit can be controlled highly accurately, and the remaining flow rate of refrigerant is supplied full to the charger cooling unit having a greater refrigerant flow rate requirement, whereby the charger can be cooled in an ensured fashion.

According to the third and eighth aspects, the cooling circuit has the bypass flow path which bypasses the high-voltage battery cooling unit and the flow path selector which selects the flow paths, and therefore, the supply of refrigerant to the high-voltage battery cooling unit can selectively be cut off by the simple circuit configuration.

According to the fourth and ninth aspects, since the flow path selector is made up of the solenoid valve, the temperature of the high-voltage battery can be controlled appropriately based on the flow path selecting control corresponding to the requirement of the high-voltage battery.

According to the fifth and tenth aspects, the flow path selector is made up of the three-way solenoid valve which is provided at the branch portion where the bypass flow path branches off from the upstream-side flow path of the high-voltage battery cooling unit, and therefore, it is possible to make a selection between a state where the refrigerant is supplied full to the high-voltage battery cooling unit and the high-voltage system equipment cooling unit (the DC-DC converter cooling unit and the charger cooling unit) and a state where the refrigerant is supplied full to only the high-voltage system equipment cooling unit based on the selecting control of the three-way solenoid valve.

According to the sixth aspect, at least two cooling units which make up the high-voltage system equipment cooling unit are disposed in parallel to each other, and therefore, the pressure loss can be reduced when compared with the case where the at least two cooling units are disposed in series. Additionally, even though the refrigerant flow rate requirements of the at least two cooling units are different, the refrigerant matching the respective refrigerant flow rate requirements can be supplied to the cooling units without any waste, and therefore, the delivery capacity of the cooling pump can be suppressed. Since the high-voltage battery cooling unit is disposed on the upstream side of the high-voltage system equipment cooling unit, even in such a situation that both the high-voltage battery and the high-voltage system equipment are cooled together, the high-voltage battery can be cooled in an ensured fashion without being affected by the temperature of the high-voltage system equipment.

MODE FOR CARRYING OUT THE INVENTION

Figure 1:
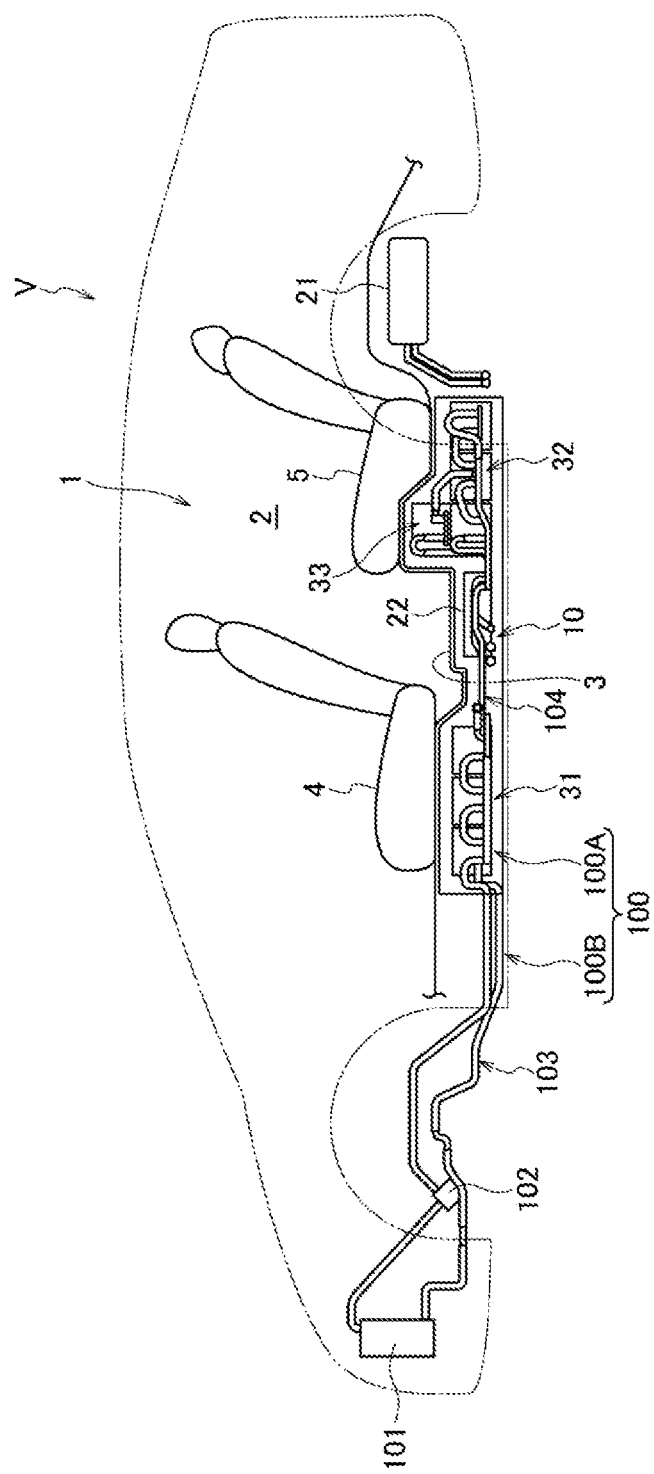
FIG. 1 is a schematic side view of a vehicle on which a vehicle power source system according to an embodiment of the invention is mounted.

Hereinafter, an embodiment of a vehicle power source system of the invention will be described based on the accompanying drawings. The drawings should be seen in a direction in which given reference numerals look normal.

[Vehicle Power Source System]

As shown in FIG. 1, a vehicle power source system 1 according to an embodiment of the invention includes mainly a plurality of battery modules 31 to 33, a DC-DC converter 22, a charger 21, and a cooling circuit 100 for cooling these constituent parts and is mounted on a vehicle V such as a hybrid electric vehicle, an electric vehicle and a fuel cell vehicle. The plurality of battery modules 31 to 33, the DC-DC converter 22, and part of the cooling circuit 100 are unitized to make up a battery unit 10, which is disposed below a floor panel 3 which makes up a floor surface of a passenger compartment 2. A radiator 101 and a cooling pump 102, which make up the cooling circuit 100, are disposed at a front portion of the vehicle V. The charger 21, which charges the battery modules 31 to 33 using electric power supplied from an exterior power source, is disposed at a rear portion of the vehicle V The battery unit 10 is held therebetween. The cooling circuit 100 has an interior cooling circuit 100A which is disposed inside the battery unit 10 and an exterior cooling circuit 100B which is disposed outside the battery unit 10.

[Battery Unit]

Figure 2:
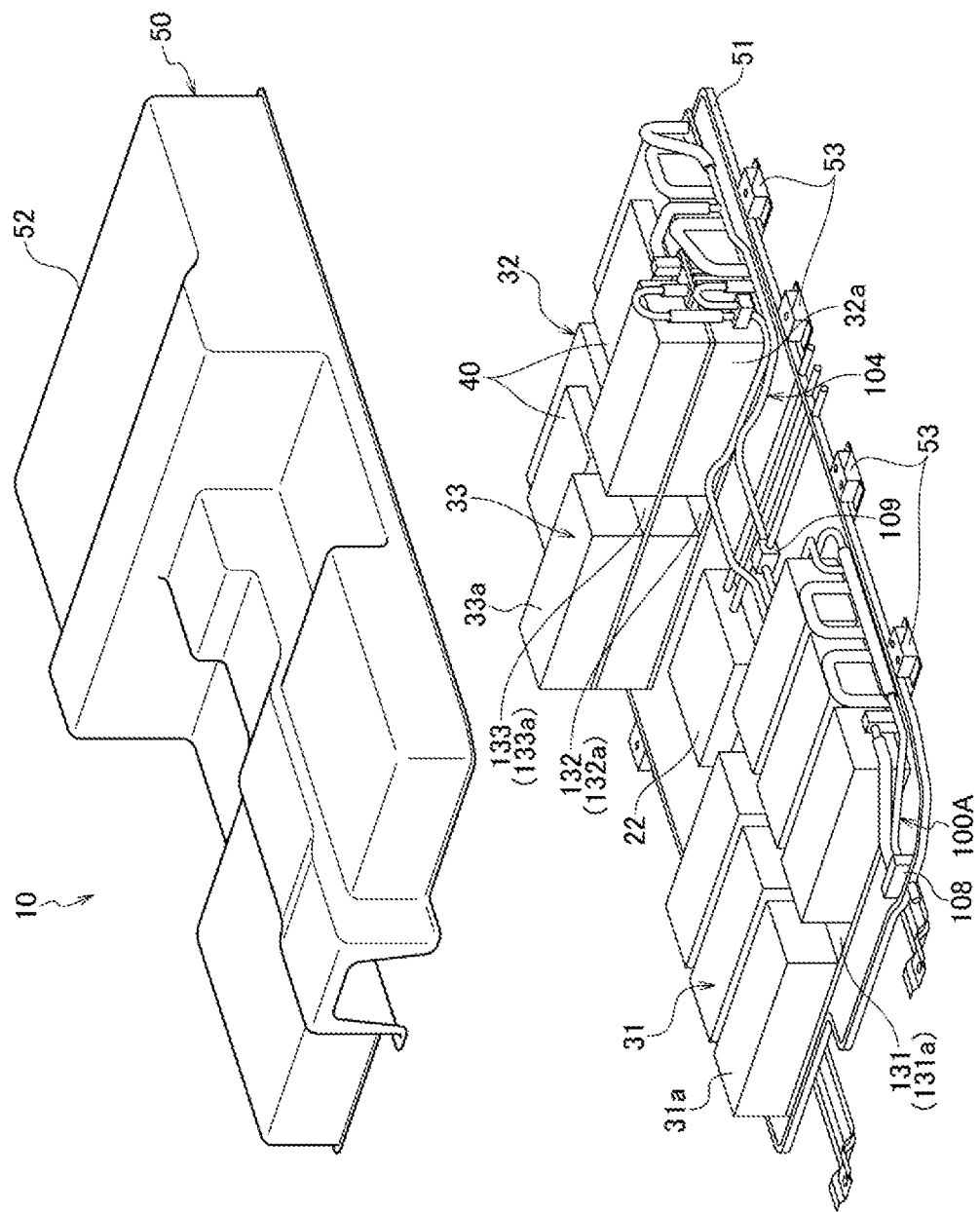
FIG. 2 is an exploded perspective view showing battery units of the vehicle power source system according to the embodiment of the invention.
Figure 3:
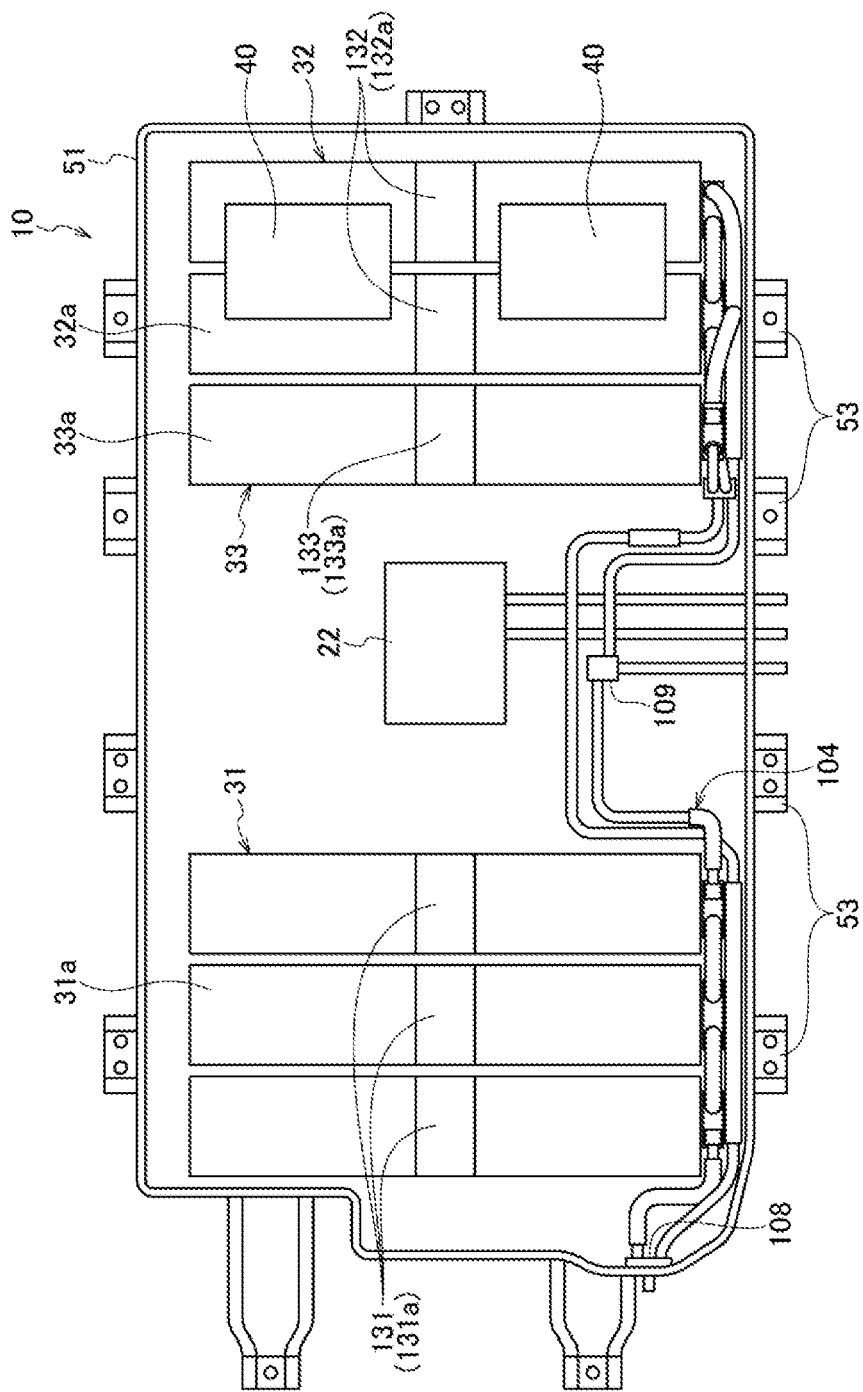
FIG. 3 is an interior plan view showing the battery units of the vehicle power source system according to the embodiment of the invention.

As shown in FIGS. 2 and 3, the battery unit 10 includes the plurality of battery modules 31 to 33, the DC-DC converter 22, battery ECUs 40, the interior cooling circuit 100A and a case 50 which accommodates those constituent parts.

The case 50 is made up of a bottom plate 51 on which the plurality of battery modules 31 to 33, the DC-DC converter 22, the battery ECUs 40, and the interior cooling circuit 100A are mounted, and a cover 52 which covers those constituent parts from above. A plurality of brackets 53 which run transversely below the bottom plate 51 are fastened to floor frames (not shown) that are provided transversely inwards of side sills and that are provided parallel to side sills which are provided on both sides of the vehicle V. Thus the battery unit 10 is attached to the vehicle V in such a way as to be suspended below the floor panel 3.

The plurality of battery modules 31 to 33 include a front battery module 31 which is accommodated in a front portion of the case 50 and two rear battery modules 32, 33 which are accommodated in a rear portion of the case 50, and the battery modules 31 to 33 each have a plurality of high-voltage batteries 31*a* to 33*a*. In this embodiment, the front battery module 31 is made up of a total of six high-voltage batteries 31*a* which are arranged two in a left-right direction and three in a front-rear direction. One rear battery module 32 (hereinafter, also, referred to as a "lower rear battery module 32") is made up of a total of six high-voltage batteries 32*a* which are similarly arranged two in the left-right direction and three in the front-rear direction. The other rear battery module 33 (hereinafter, also, referred to as an "upper rear battery module 33") is made up of two high-voltage batteries 33*a* which are arranged in the left-right direction.

The plurality of battery modules 31 to 33 are disposed below front seats 4 and a rear seat 5 of the vehicle V.

Specifically, the front battery module 31 is disposed below the front seats 4, and the lower rear battery module 32 and the upper rear battery module 33 are disposed below the rear seat 5.

In disposing the front battery module 31 below the front seats 4, the high-voltage batteries 31*a* are laid out flat without being superposed. In disposing the lower rear battery module 32 and the upper rear battery module 33 below the rear seat 5, the lower rear battery module 32 and the upper rear battery module 33 are superposed vertically under a front portion of a seat cushion of the rear seat 5. Specifically, the two high-voltage batteries 33*a* which make up the upper rear battery module 33 are disposed above the two high-voltage batteries 32*a* which are arranged frontmost in the six high-voltage batteries 32*a* which make up the lower rear battery module 32.

The DC-DC converter 22 is the high-voltage system equipment which converts a direct current and is disposed between the front battery module 31 and the rear battery modules 32, 33 and at a transverse center of the battery unit 10. The battery ECUs 40 are battery controllers which control the charging and discharging of the high-voltage batteries 31*a* to 33*a*, as well as temperatures thereof and are disposed behind the upper rear battery module 33 and above the lower rear battery module 32.

The DC-DC converter 22 and the charger 21 are more heat-resistant than the high-voltage batteries 31*a* to 33*a*, and their control temperatures are set higher than those of the high-voltage batteries 31*a* to 33*a*. For example, assuming that the upper limit temperature of the high-voltage batteries 31*a* to 33*a* is 60° C., the upper limit temperatures of the DC-DC converter 22 and the charger 21 are set at 80° C., and hence, under a high-temperature environment, the high-voltage batteries 31*a* to 33*a* need to be cooled in preference to the DC-DC converter 22 and the charger 21. On the other hand, in charging, since the charger 21 is heated to high temperatures, there may be a situation in which although the high-voltage batteries 31*a* to 33*a* do not have to be cooled, only the DC-DC converter 22 and the charger 21 need to be cooled.

The interior cooling circuit 100A will be described below together with the exterior cooling circuit 100B.

[Configuration of Cooling Circuit]

Figure 4:
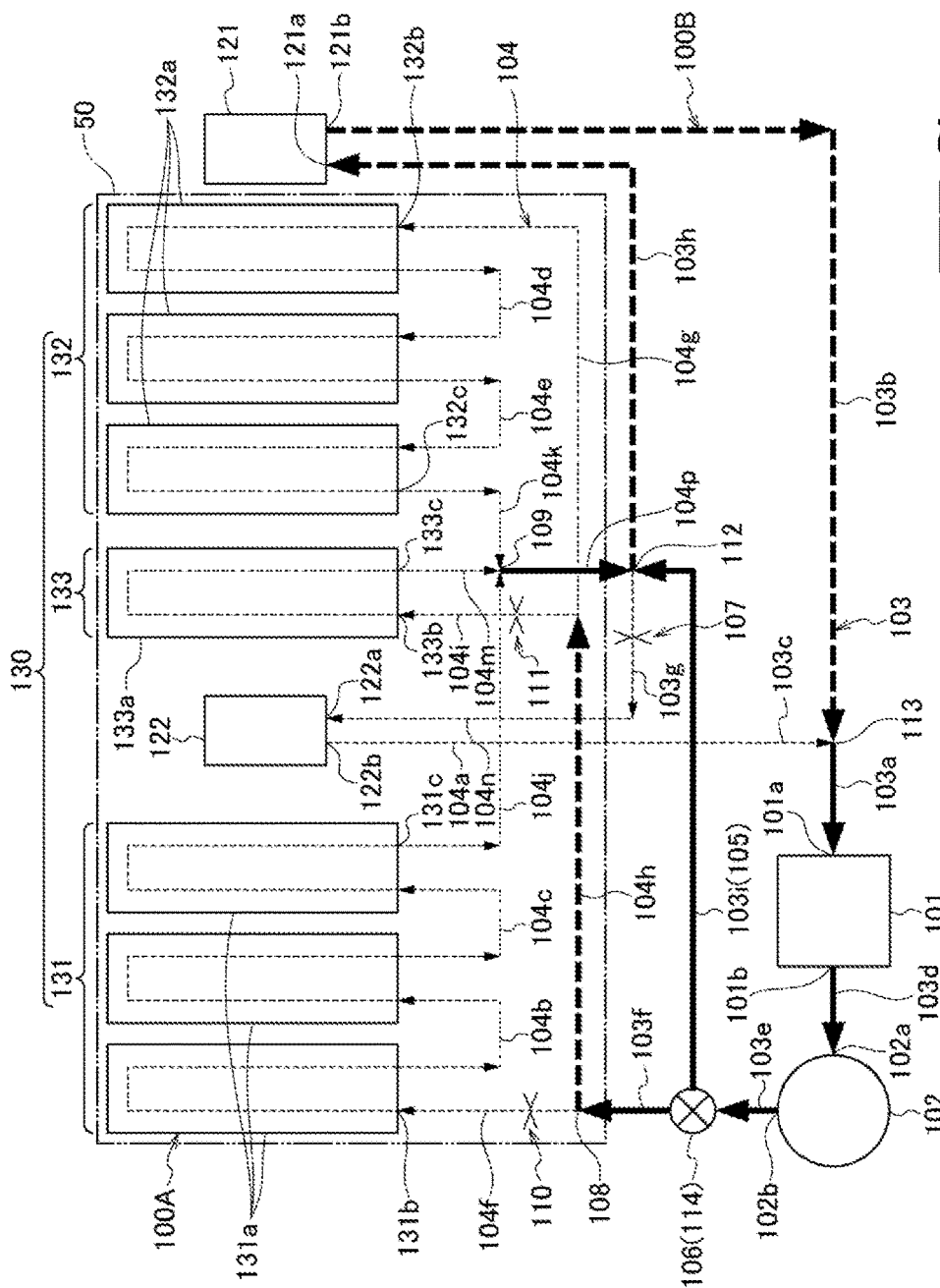
FIG. 4 is a circuit diagram showing the configuration of a cooling circuit of the vehicle power source system according to the embodiment of the invention.

As shown in FIG. 4, in the cooling circuit 100, the radiator 101, the cooling pump 102, a high-voltage battery cooling unit 130, a DC-DC converter cooling unit 122, and a charger cooling unit 121 are connected together by an external piping 103 which is laid out outside the battery unit 10 and an internal piping 104 which is laid out inside the battery unit 10 to thereby form a refrigerant circulation path.

The radiator 101 radiates heat of a refrigerant which flows in from an inlet port 101*a* and discharges the refrigerant which is cooled as a result of the heat being radiated therefrom from an outlet port 101*b*. The inlet port 101*a* of the radiator 101 is connected to an outlet port 121*b* of the charger cooling unit 121 by way of a first external piping 103*a* and a second external piping 103*b* and is connected to an outlet port 122*b* of the DC-DC converter cooling unit 122 by way of the first external piping 103*a*, a third external piping 103*c* and a first internal piping 104*a*. The outlet port 101*b* of the radiator 101 is connected to a suction port 102*a* of the cooling pump 102 by way of a fourth external piping 103*d*.

The cooling pump 102 discharges the refrigerant sucked in from the suction port 102*a* from a discharge port 102*b* in response to a driving of an electric motor (not shown). The discharge port 102*b* of the cooling pump 102 is connected to a branch portion 108 which is an inlet port of the high-voltage battery cooling unit 130 by way of a fifth external piping 103e and a sixth external piping 103f.

The high-voltage battery cooling unit 130 has a plurality of battery module cooling units 131 to 133 for cooling the plurality of battery modules 31 to 33. A front battery module cooling unit 131 for cooling the front battery module 31 has three cooling jackets 131a which are arranged in the front-rear direction for cooling the three pairs of transversely arranged high-voltage batteries 31a, and these cooling jackets 131a are connected in series by way of a second internal piping 104b and a third internal piping 104c. A lower rear battery module cooling unit 132 for cooling the lower rear battery module 32 has three cooling jackets 132a which are arranged in the front-rear direction for cooling the three pairs of transversely arranged two high-voltage batteries 32a, and these cooling jackets 132a are connected in series by way of a fourth internal piping 104d and a fifth internal piping 104e. An upper rear battery module cooling unit 133 for cooling the upper rear battery module 33 has a single cooling jacket 133a for cooling the pair of transversely arranged two high-voltage batteries 33a.

In the high-voltage battery cooling unit 130, the plurality of battery module cooling units 131 to 133 are arranged in parallel. Specifically, an outlet port 131b of the front battery module cooling unit 131 is connected to the branch portion 108 by way of a six internal piping 104f, an inlet port 132b of the lower rear battery module cooling unit 132 is connected to the branch portion 108 by way of a seventh internal piping 104g and an eighth internal piping 104h, and an inlet port 133b of the upper rear battery module cooling unit 133 is connected to the branch portion 108 by way of a ninth internal piping 104i and the eighth internal piping 104h. An outlet port 131c of the front battery module cooling unit 131 is connected to a merging portion 109 by way of a tenth internal piping 104j, an outlet port 132c of the lower rear battery module cooling unit 132 is connected to the merging portion 109 by way of an eleventh internal piping 104k, and an outlet port 133c of the upper rear battery module cooling unit 133 is connected to the merging portion 109 by way of a twelfth internal piping 104m.

Then, in the battery unit 10, in arranging the plurality of battery module cooling units 131 to 133 in parallel, the branch portion 108 which is provided at the upstream side of the plurality of battery module cooling units 131 to 133 and the merging portion 109 which is provided at the downstream side of the plurality of battery module cooling units 131 to 133 are both provided inside the case 50.

In the high-voltage battery cooling unit 130, in arranging the plurality of battery module cooling units 131 to 133 in parallel, orifices 110, 111, which function as flow rate control devices, are provided at the upstream side (or downstream side) of the battery module cooling units 131 to 133 for cooling the battery modules 31 to 33 having a small battery capacity in the plurality of battery modules 31 to 33 and at the downstream side of the branch portion 108.

For example, since the front battery module 31 has a battery capacity which is smaller than a total battery capacity of the two lower rear battery module 32 and upper rear battery module 33, the orifice 110 as the flow rate control device is provided at the upstream side of the front battery module cooling unit 131 (along the sixth internal piping 104f) for cooling the front battery module 31. In addition, since the upper rear battery module 33 has a battery capacity which is smaller than a battery capacity of the lower rear battery module 32, the orifice 111 as the flow rate control device is provided at the upstream side of the upper rear battery module cooling unit 133 for cooling the upper rear battery module 33 (along the ninth inner piping 104i).

The DC-DC converter cooling unit 122 is a cooling jacket which is incorporated in the DC-DC converter 22 or a cooling jacket which is disposed adjacent to the DC-DC converter 22, and the charger cooling unit 121 is a cooling jacket incorporated in the charger 21 or a cooling jacket which is disposed adjacent to the charger 21. Then, the DC-DC converter cooling unit 122 and the charger cooling unit 121 are connected in parallel to each other and are disposed on the downstream side of the high-voltage battery cooling unit 130.

Specifically, an inlet port 122a of the DC-DC converter cooling unit 122 is connected to a branch portion 112 by way of a thirteenth inner piping 104n and a seventh external piping 103g, and an inlet port 121a of the charger cooling unit 121 is connected to the branch portion 112 by way of an eighth external piping 103h. In addition, an outlet port 122b of the DC-DC converter cooling unit 122 is connected to a merger portion 113 by way of the first inner piping 104a and the third external piping 103c, and an outlet port 121b of the charger cooling unit 121 is connected to the merging portion 113 by way of the second external piping 103b. Then, the branch portion 112 is connected to the merging portion 109 of the high-voltage battery cooling unit 130 by way of a fourteenth internal piping 104p, and the merging portion 113 is connected to the inlet port 101a of the radiator 101 by way of the first external piping 103a.

In the cooling circuit 100, in connecting the DC-DC converter cooling unit 122 and the charger cooling unit 121 in parallel, an orifice 107, which functions as a flow rate control device, is provided at the upstream side (or downstream side) of the DC-DC converter cooling unit 122 which has a smaller flow rate requirement than that of the charger cooling unit 121. Specifically, the orifice 107 is provided at the seventh external piping 103g to limit the flow rate of the refrigerant which flows into the DC-DC converter cooling unit 122, so that the remaining flow rate of the refrigerant is supplied to the charger cooling unit 121. In general, a charger has a greater heat value than that of a DC-DC converter, and therefore, the flow rate of the refrigerant for cooling the charger 21 is set greater than the flow rate of the refrigerant for cooling the DC-DC converter 22, so as to cool the charger 21 positively.

Further, in the cooling circuit 100, a bypass flow path 105 is provided which connects an upstream side of the high-voltage battery cooling unit 130 to a portion that is positioned on the upstream side of the high-voltage system equipment cooling unit 120 (the DC-DC converter cooling unit 122 and the charger cooling unit 121) and that is positioned on the downstream side of the high-voltage battery cooling unit 130. Specifically, a connecting portion between the fifth external piping 103e and the sixth external piping 103f is referred to as a branch portion 114, and the branch portion 114 is connected to the branch portion 112 of the high-voltage system equipment cooling unit 120 by way of a ninth external piping 103i which makes up the bypass flow path 105. Then, a three-way solenoid valve 106, which functions as a flow path selector, is provided at the branch portion 114.

When the three-way solenoid valve 106 is off, the fifth external piping 103e and the sixth external piping 103f are connected, whereby the refrigerant discharged from the cooling pump 102 is supplied to the high-voltage battery cooling unit 130, while the fifth external piping 103e is disconnected from the bypass flow path 105 (the ninth external piping 103i), whereby the direct supply of the refrigerant to the DC-DC converter cooling unit 122 and the charger cooling unit 121 is cut off. On the other hand, when the three-way solenoid valve 106 is on, the fifth external piping 103e and the bypass flow path 105 (the ninth external piping 103i) are connected, whereby the refrigerant discharged from the cooling pipe 102 is supplied to the DC-DC converter cooling unit 122 and the charger cooling unit 121, while the fifth external piping 103e is disconnected from the sixth external piping 103f, whereby the supply of the refrigerant to the high-voltage battery cooling unit 130 is cut off. In FIG. 4, arrows denote flows of the refrigerant, and there is no such situation that both the sixth external piping 103f and the bypass flow path 105 (the ninth external piping 103i) are connected to the fifth external piping 103e.

Figure 5:
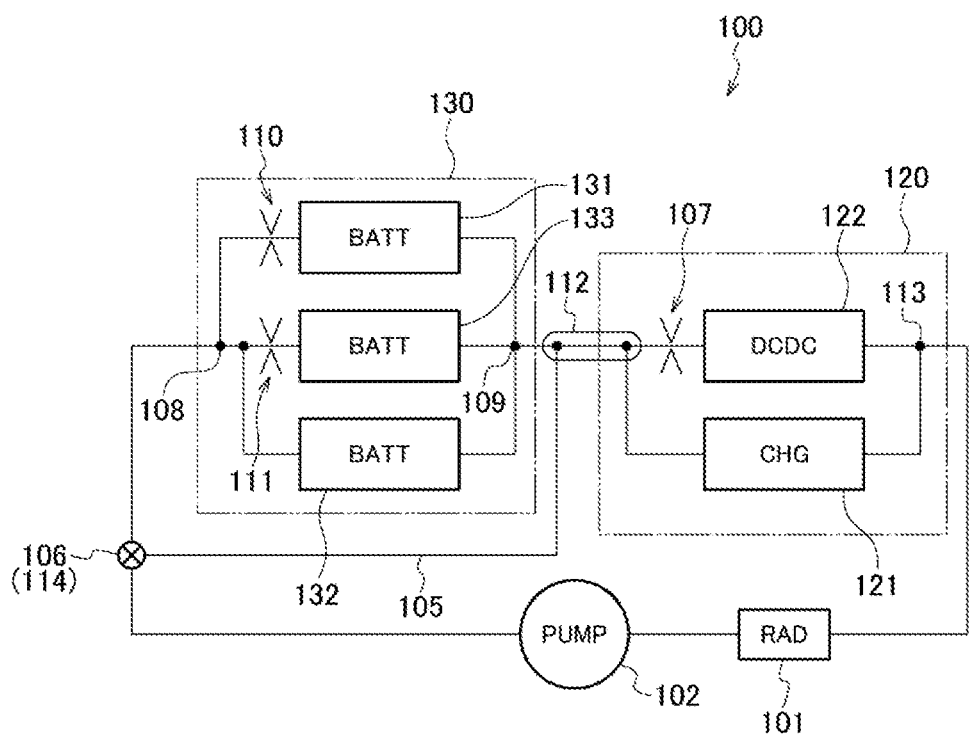
FIG. 5 is a schematic block diagram of the cooling circuit of the vehicle power source system according to the embodiment of the invention.

FIG. 5 is a schematic block diagram of the cooling circuit 100 which has been described in detail by using FIG. 4. In the figure, a reference character CHG denotes the charger cooling unit 121, a reference character DCDC denotes the DC-DC converter cooling unit 122, and reference characters BATT denote the battery module cooling units 131 to 133 (this will be true with FIGS. 6 to 9, which will be described below).

As shown in FIG. 5, in the cooling circuit 100 of this embodiment, the radiator 101, the cooling pump 102, the high-voltage converter cooling unit 130, and the high-voltage system equipment cooling unit 120 made up of the charger cooling unit 121 and the DC-DC cooling unit 122 are connected in series, and the high-voltage system equipment cooling unit 120 is disposed on the downstream side of the high-voltage battery cooling unit 130. Additionally, the upstream side of the high-voltage battery cooling unit 130, the upstream side of the high-voltage system equipment cooling unit 120 and the downstream side of the high-voltage battery cooling unit 130 are connected by the bypass flow path 105, and the three-way solenoid valve 106 is provided at the branch portion 114 where the bypass flow path 105 branches off from an upstream-side flow path of the high-voltage battery cooling unit 130. Further, the high-voltage battery cooling unit 130 is made up of the three battery module cooling units 131 to 133 which are disposed in parallel, and the high-voltage system equipment cooling unit 120 is made up of the DC-DC converter cooling unit 122 and the charger cooling unit 121 which are disposed in parallel.

[Operation of Cooling Circuit]

Figure 6:
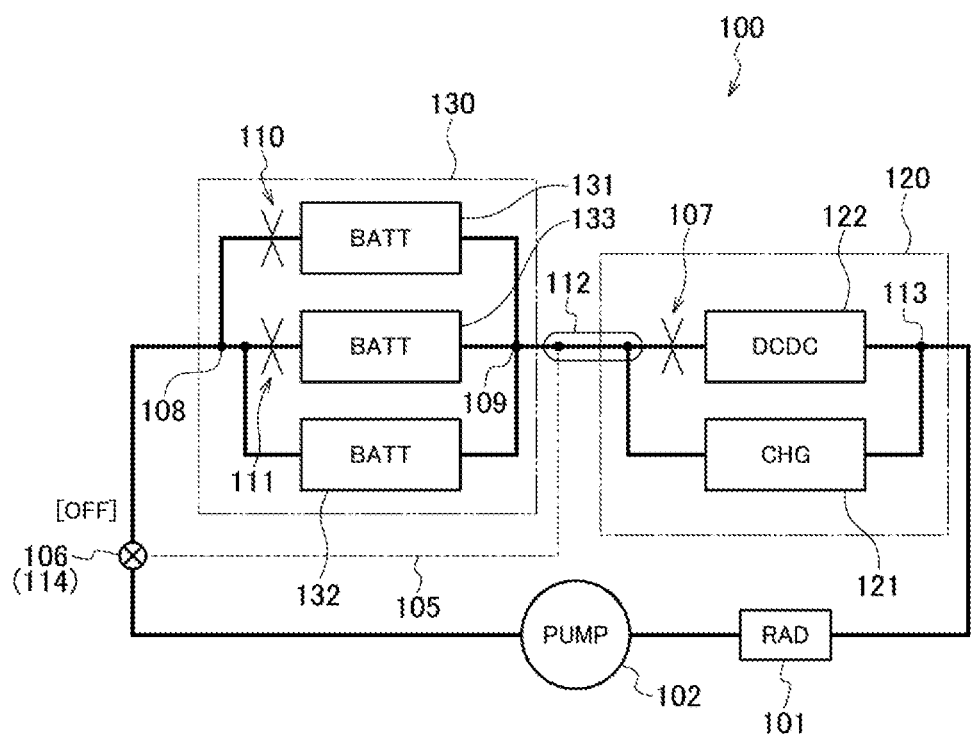
FIG. 6 is a schematic block diagram showing a flow of a refrigerant when a three-way solenoid valve is off in the cooling circuit shown in FIG. 5.
Figure 7:
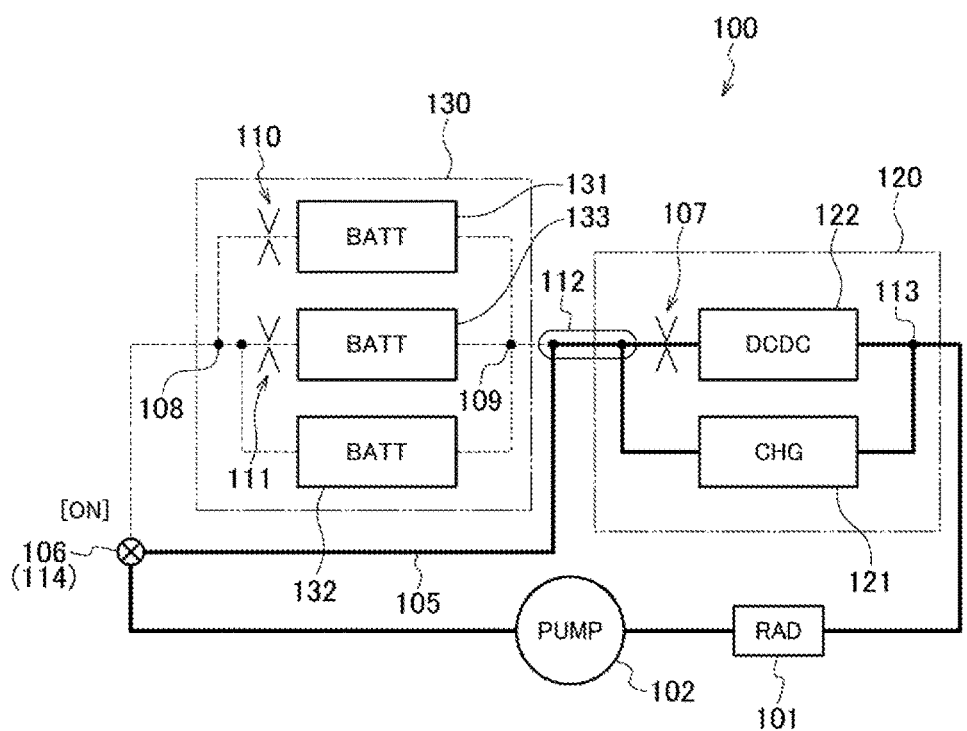
FIG. 7 is a schematic block diagram showing a flow of the refrigerant when the three-way solenoid valve is on in the cooling circuit shown in FIG. 5.

Next, the operation of the cooling circuit 100 will be described by reference to FIGS. 6 and 7. In FIGS. 6 and 7, the flow paths through which the refrigerant flows are indicated by solid lines, whereas the flow paths through which no refrigerant flows are indicated by broken lines.

<Three-Way Solenoid Valve [OFF]>

In the cooling circuit 100 configured in the way described above, when the cooling pump 102 is driven, the cooling pump 102 sucks in the refrigerant whose temperature is low from the radiator 101 side and discharges the refrigerant so sucked towards the high-voltage battery cooling unit 130. In a normal state, since the three-way solenoid valve 106 is off, as shown in FIG. 6, the refrigerant discharged from the cooling pump 102 does not flow to the bypass flow path 105 but is supplied full to the high-voltage battery cooling unit 130.

The refrigerant which is supplied to the high-voltage battery cooling unit 130 is at first distributed to the front battery module cooling unit 131 and the rear battery module cooling units 132, 133 at the branch portion 108. As this occurs, the flow rate of the refrigerant towards the front battery module cooling unit 131 is restricted at the orifice 110, whereby a greater amount of refrigerant than the amount of refrigerant supplied to the front battery module cooling unit 131 is supplied to the rear battery module cooling units 132, 133. The refrigerant supplied to the rear battery module cooling units 132, 133 are distributed further to the lower rear battery module cooling unit 132 and the upper rear battery module cooling unit 133. In this situation, the flow rate of the refrigerant towards the upper rear battery module cooling unit 133 side is restricted at the orifice 111, whereby a greater amount of refrigerant than an amount of refrigerant which is to be distributed to the upper rear battery module cooling unit 133 is supplied to the lower rear battery module cooling unit 132.

The flows of refrigerant which pass through the three battery module cooling units 131 to 133 merge together at the merging portion 109, whereafter the refrigerant is distributed to the DC-DC converter cooling unit 122 and the charger cooling unit 121 by way of the branch portion 112. In this situation, the flow rate of the refrigerant distributed to the DC-DC converter cooling unit 122 side is restricted by the orifice 107, whereby a greater amount of refrigerant than the amount of the refrigerant distributed to the DC-DC converter cooling unit 122 is supplied to the charger cooling unit 121. Then, the flows of refrigerant which pass through the DC-DC converter cooling unit 122 and the charger cooling unit 121 merge together at the merging portion 113, whereafter the refrigerant returns to the radiator 101 where the refrigerant is cooled.

<Three-Way Solenoid Valve [ON]>

In the cooling circuit 100, in the event that the high-voltage batteries 31a to 33a do not have to be cooled, or in the event that the DC-DC converter 22 and the charger 21 need to be cooled although the temperature of the refrigerant is not suited to the temperature requirement of the high-voltage batteries 31a to 33a, the three-way solenoid valve 106 is controlled to be on, whereby as shown in FIG. 7, the supply of the refrigerant to the high-voltage battery cooling unit 130 is cut off, so that only the DC-DC converter 22 and the charger 21 can be cooled. Namely, when the three-way solenoid valve 106 is on, the refrigerant discharged form the cooling pump 102 does not flow to the high-voltage battery cooling unit 130 but is supplied full to the bypass flow path 105. The refrigerant supplied to the bypass flow path 105 bypasses the high-voltage battery cooling unit 130 to be distributed to the DC-DC converter cooling unit 122 and the charger cooling unit 121 by way of the branch portion 112. In this situation, the flow rate of the refrigerant distributed to the DC-DC converter cooling unit 122 side is restricted by the orifice 107, whereby a greater amount of refrigerant than the amount of the refrigerant distributed to the DC-DC converter cooling unit 122 is supplied to the charger cooling unit 121. Then, the flows of refrigerant which pass through the DC-DC converter cooling unit 122 and the charger cooling unit 121 merge together at the merging portion 113, whereafter the refrigerant returns to the radiator 101 where the refrigerant is cooled.

Thus, as has been described heretofore, according to the vehicle power source system 1 of this embodiment, since the DC-DC converter cooling unit 122 and the charger cooling unit 121 are disposed in parallel, the pressure loss can be reduced when compared with a case where the DC-DC converter cooling unit 122 and the charger cooling unit 121 are disposed in series. Additionally, even though the refrigerant flow rate requirements of the DC-DC converter cooling unit 122 and the charger cooling unit 121 are different, the refrigerant matching the respective refrigerant flow rate requirements can be supplied to the DC-DC converter cooling unit 122 and the charger cooling unit 121 without any waste, and therefore, the delivery capacity of the cooling pump 102 can be suppressed.

Since the high-voltage battery cooling unit 130 is disposed on the upstream side of the DC-DC converter cooling unit 122 and the charger cooling unit 121, even in such a situation that both the high-voltage batteries 31a to 33a and the high-voltage system equipment are cooled together, the high-voltage batteries 31a to 33a whose control temperatures are lower can be cooled in an ensured fashion without being affected by the temperature of the high-voltage system equipment.

The cooling circuit 100 has the orifice 107 on the upstream side or downstream side of the DC-DC converter cooling unit 122, and therefore, the flow rate of the refrigerant supplied to the DC-DC converter cooling unit 122 can be controlled highly accurately, and the remaining flow rate of the refrigerant is supplied full to the charger cooling unit 121 having the greater refrigerant flow rate requirement, whereby the charger 21 can be cooled in an ensured fashion.

The cooling circuit 100 has the bypass flow path 105 which bypasses the high-voltage battery cooling unit 130 and the three-way solenoid valve 106 which is a solenoid valve functioning as a flow path selector which selects the flow paths, and therefore, the supply of refrigerant to the high-voltage battery cooling unit 130 can selectively be cut off by the simple circuit configuration. In addition, the temperatures of the high-voltage batteries 31a to 33a can be controlled appropriately based on the flow path selecting control corresponding to the requirements of the high-voltage batteries 31a to 33a.

The three-way solenoid valve 106 is provided at the branch portion 114 where the bypass flow path 105 branches off from the upstream-side flow path of the high-voltage battery cooling unit 130, and therefore, it is possible to make a selection between a state where the refrigerant is supplied full to the high-voltage battery cooling unit 130 and the high-voltage system equipment cooling unit 120 (the DC-DC converter cooling unit 122 and the charger cooling unit 121) and a state where the refrigerant is supplied full to only the high-voltage system equipment cooling unit 120 based on the selecting control of the three-way solenoid valve 106.

The invention is not limited to the embodiment which has been described heretofore and hence can be modified or improved as required.

For example, in the embodiment described above, the high-voltage battery cooling unit 130 is described as being made up of the three battery module cooling units 131 to 133 so as to correspond individually to the three battery modules 31 to 33. However, the invention is not limited thereto, and hence, one, two, four or more battery module cooling units may be provided. The battery module cooling units do not always have to be connected in parallel, and hence, the battery module cooling units are partially or wholly connected in series.

In the embodiment described above, the high-voltage system equipment is described as being made up of the DC-DC converter 22 and the charger 21. However, the high-voltage system equipment may include other high-voltage system equipment such as an inverter, as long as the high-voltage system equipment cooling unit 120 includes two or more cooling units.

For example, the cooling circuit 100 described above may be a water-cooled cooling circuit which utilizes water as a refrigerant or an oil-cooled cooling circuit which utilizes oil as a refrigerant.

This patent application is based on Japanese Patent Application (No 2014-245940) filed on Dec. 4, 2014, the contents of which are incorporated herein by reference.

DESCRIPTION OF REFERENCE NUMERALS AND CHARACTER

1 Vehicle power supply unit
21 Charger (high-voltage system equipment)
22 DC-DC converter (high-voltage system equipment)
31a to 33a High-voltage battery
100 Cooling circuit
101 Radiator
102 Cooling pump
103f Sixth external piping (upstream side flow path of high-voltage battery cooling unit)
105 Bypass flow path
106 Solenoid three-way valve (flow path selector)
107 Orifice (flow rate control unit)
120 High-voltage system equipment cooling unit
121 Charger cooling unit (cooling unit)
122 DC-DC converter cooling unit (cooling unit)
130 High-voltage battery cooling unit

The invention claimed is:

1. A vehicle power source system comprising:
a high-voltage battery;
a high-voltage system equipment having a DC-DC converter and a charger; and
a cooling circuit having a high-voltage battery cooling unit for cooling the high-voltage battery, a DC-DC converter cooling unit for cooling the DC-DC converter, and a charger cooling unit for cooling the charger, wherein
in the cooling circuit, the DC-DC converter cooling unit and the charger cooling unit are disposed in parallel on a downstream side of the high-voltage battery cooling unit,
the cooling circuit has a flow rate control device on an upstream side of the DC-DC converter cooling unit,
the flow rate control device is disposed between a branch portion where a flow to the DC-DC converter cooling unit and a flow to the charger cooling unit are branched off, and the DC-DC converter cooling unit, and
the flow rate control device is not disposed between the branch portion and the charger cooling unit.

2. The vehicle power source system according to claim 1, wherein
the cooling circuit has:
a bypass flow path which connects an upstream side of the high-voltage battery cooling unit to a portion that is positioned on an upstream side of the DC-DC converter cooling unit and the charger cooling unit and that is positioned on a downstream side of the high-voltage battery cooling unit; and
a flow path selector which is provided on the upstream side of the high-voltage battery cooling unit.

3. The vehicle power source system according to claim 2, wherein
the flow path selector is a solenoid valve.

4. The vehicle power source system according to claim 2, wherein
the flow path selector is a three-way solenoid valve which is provided at a branch portion where the bypass flow path branches off from an upstream-side flow path of the high-voltage battery cooling unit.

5. A cooling circuit comprising:

a radiator;

a cooling pump;

a high-voltage battery cooling unit for cooling a high-voltage battery; and a high-voltage system equipment cooling unit for a cooling high-voltage system equipment, wherein the radiator, the cooling pump, the high-voltage battery cooling unit, and the high-voltage system equipment cooling unit being connected in series, the high-voltage system equipment cooling unit has at least two cooling units, the at least two cooling units are disposed in parallel on a downstream side of the high-voltage battery cooling unit, the at least two high-voltage system equipment cooling units include a DC-DC converter cooling unit and a charger cooling unit, a flow rate control device is provided on an upstream side of the DC-DC converter cooling unit, the flow rate control device is disposed between a branch portion where a flow to the DC-DC converter cooling unit and a flow to the charger cooling unit are branched off, and the DC-DC converter cooling unit, and the flow rate control device is not disposed between the branch portion and the charger cooling unit.

6. The cooling circuit according to claim 5, wherein the cooling circuit has:

a bypass flow path which connects an upstream side of the high-voltage battery cooling unit to a portion that is positioned on an upstream side of the DC-DC converter cooling unit and the charger cooling unit and that is positioned on a downstream side of the high-voltage battery cooling unit; and a flow path selector which is provided on the upstream side of the high-voltage battery cooling unit.

7. The cooling circuit according to claim 6, wherein the flow path selector is a solenoid valve.

8. The cooling circuit according to claim 6, wherein the flow path selector is a three-way solenoid valve which is provided at a branch portion where the bypass flow path branches off from an upstream-side flow path of the high-voltage battery cooling unit.

\* \* \* \* \*